(12) United States Patent
Won et al.

(10) Patent No.: US 6,827,987 B2
(45) Date of Patent: Dec. 7, 2004

(54) METHOD OF REDUCING AN ELECTROSTATIC CHARGE ON A SUBSTRATE DURING A PECVD PROCESS

(75) Inventors: Tae Kyung Won, San Jose, CA (US);
Soo Young Choi, Fremont, CA (US);
Takako Takehara, Hayward, CA (US);
William R. Harshbarger, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 550 days.

(21) Appl. No.: 09/927,698

(22) Filed: Jul. 27, 2001

(65) Prior Publication Data

US 2003/0031792 A1 Feb. 13, 2003

(51) Int. Cl.$^7$ ................................................ H05H 1/24
(52) U.S. Cl. .................. 427/574; 427/578; 427/255.18
(58) Field of Search .............................. 427/574, 578, 427/255.18, 255.11; 118/728, 500

(56) References Cited

U.S. PATENT DOCUMENTS

| | | | |
|---|---|---|---|
| 4,485,759 A | * | 12/1984 | Brandolf ..................... 118/503 |
| 5,514,623 A | * | 5/1996 | Ko et al. .................... 438/622 |
| 5,942,282 A | | 8/1999 | Tada et al. |
| 5,997,685 A | * | 12/1999 | Radhamohan et al. ... 156/345.1 |
| 6,120,660 A | | 9/2000 | Chu et al. |
| 6,506,291 B2 | * | 1/2003 | Tsai et al. .............. 204/298.15 |

FOREIGN PATENT DOCUMENTS

JP          10154745          11/1996          ........... H01L/21/68

* cited by examiner

Primary Examiner—Bret Chen
(74) Attorney, Agent, or Firm—Benjamin A. Adler

(57) ABSTRACT

Provided herein is a method of reducing an electrostatic charge on a substrate during a plasma enhanced chemical vapor deposition process, comprising the step of depositing a conductive layer onto a top surface of a susceptor support plate disposed within a deposition chamber wherein the conductive layer dissipates the electrostatic charge on the bottom surface of the substrate during a plasma enhanced chemical vapor deposition process. Also provided are a method of depositing a thin film during a plasma enhanced chemical vapor deposition process using the methods disclosed herein and a conductive susceptor.

29 Claims, 3 Drawing Sheets

METHOD OF REDUCING AN ELECTROSTATIC CHARGE ON A SUBSTRATE DURING A PECVD PROCESS

BACKGROUND OF THE INVENTION

1. Field of the Invention

The present invention relates generally to the fields of semiconductor manufacturing and chemical vapor deposition processes. More specifically, the present invention relates to a method of reducing the electrostatic charge on a substrate during a PECVD process.

2. Description of the Related Art

Plasma enhanced chemical vapor deposition (PECVD) of thin films uses plasma energy to create and sustain the chemical vapor deposition reaction. A radio-frequency (RF) induced plasma source ignites a plasma and creates a plasma field in the deposition gas. The increase in deposition energy enables thin films to deposit at low temperatures and low pressures, thus realizing good film uniformity and throughput.

A PECVD application is performed in a vacuum chamber with a gas distribution means as a top electrode and a substrate support means as a bottom electrode in parallel. These conducting plates are typically several inches apart; the gap is variable to optimize process conditions. Additionally, a radio-frequency power supply is used to supply electrical power between the electrodes to ignite the plasma. A modern reactor is typically a multichamber cluster tool. PECVD is used to deposit thin films onto a substrate that includes, inter alia, flat panel displays, and glass or ceramic plates or disks.

A substrate is supported by a susceptor in the vacuum chamber. The susceptor is a mechanical part of the chamber and functions as a ground or bottom electrode during PECVD processing. Generally, the susceptor has a substrate support plate that is attached to a susceptor shaft and a lift assembly to raise and lower the substrate inside the process chamber.

The substrate is typically an oxide-based material such as glass, quartz, and the susceptor material is an aluminum-based material whose surface is anodized. As an electrostatic charge is built up between two insulators, it is also generated and built up on the backside of a substrate and the top susceptor surface. Thus, during the plasma enhanced chemical vapor deposition of a thin film, both the substrate and the susceptor surface act as insulators.

The electrostatic charge generated during deposition of the film between the substrate and the susceptor surface holds the substrate to the susceptor surface. This charge must be dissipated or removed prior to lifting the substrate from the susceptor surface. Additional steps such as a power lift are used to remove the electrostatic charge. If the electrostatic charge is not properly dissipated prior to separating the substrate from the susceptor surface for unloading, the electrostatic charge can induce substrate breakage when the susceptor moves down. The power lift steps consist of a few steps of gas plasma such as hydrogen that does not affect the deposited film.

The plasma of the inactive gas used for the power lift causes the electrostatic charge on the susceptor support plate and the substrate body to redistribute, thereby limiting the electrostatic attraction between the substrate and the susceptor. Thus, sticking of the substrate to the susceptor support surface is reduced and the substrate is more easily separated from the susceptor support plate. Although this step minimizes losses due to substrate damage, each power lift application requires 15–20 seconds of processing time for each substrate. This additional processing time causes a significant reduction in throughput efficiency and concomitant loss of revenue.

Therefore, the prior art is deficient in the lack of effective means of reducing static charge on a substrate during film deposition. Specifically, the prior art is deficient in the lack of an effective means of using a conductive susceptor to reduce static charge on a substrate. The present invention fulfills these long-standing needs and desires in the art.

SUMMARY OF THE INVENTION

In one embodiment of the present invention there is provided a method of reducing an electrostatic charge on a substrate during a plasma enhanced chemical vapor deposition process, comprising the step of depositing a conductive layer onto a top surface of a susceptor support plate disposed within a deposition chamber wherein the conductive layer dissipates the electrostatic charge on the bottom surface of the substrate during a plasma enhanced chemical vapor deposition process.

In another embodiment of the present invention there is provided a method of reducing an electrostatic charge on an oxide-based substrate during a plasma enhanced chemical vapor deposition process, comprising the steps of introducing silane into the deposition chamber; introducing from about 0.5% to about 1.0% phosphine in hydrogen gas into the deposition chamber; igniting the gases with an RF power of about 300 W to about 900 W at a pressure of about 0.3 Torr to about 10 Torr; and depositing a phosphine-doped amorphous silicon conductive layer or a phosphine-doped microcrystal silicon conductive layer onto a top surface of a susceptor support plate; where the phosphine-doped amorphous silicon conductive layer or the phosphine-doped microcrystal silicon conductive layer dissipates the electrostatic charge on the bottom surface of the oxide-based substrate during a plasma enhanced chemical vapor deposition process.

In yet another embodiment of the present invention there is provided a method of depositing a film of material upon a substrate during a plasma enhanced chemical vapor deposition process comprising the steps of introducing a silicon-containing gas into the deposition chamber; igniting the gas under conditions such that a plasma is formed in the deposition chamber; depositing an amorphous silicon conductive layer or a microcrystal silicon conductive layer onto a top surface of a susceptor support plate; positioning the substrate on the amorphous silicon conductive layer or on the microcrystal silicon conductive layer such that an electrostatic charge on the bottom surface of the substrate induced during a subsequent plasma enhanced chemical vapor deposition process is dissipated through the amorphous silicon conductive layer or through the microcrystal silicon conductive layer; and subjecting the top surface of the substrate to a plasma enhanced chemical vapor deposition process thereby depositing the film of material onto the substrate.

In yet another embodiment of the present invention there is provided a method of depositing a film of material upon an oxide-based substrate during a plasma enhanced chemical vapor deposition process comprising the steps of introducing silane into the deposition chamber; introducing from about 0.5% to about 1% phosphine in hydrogen gas into the deposition chamber; igniting the gases with an RF power of about 300 W to about 900 W at a pressure of about 0.3 Torr to about 10 Torr; depositing a phosphine-doped amorphous silicon conductive layer or a phosphine-doped microcrystal silicon conductive layer onto a top surface of a susceptor support plate; positioning the oxide-based substrate on the phosphine-doped amorphous silicon conductive layer or on the phosphine-doped microcrystal silicon conductive layer such that an electrostatic charge on the bottom surface of the oxide-based substrate induced during subsequent plasma enhanced chemical vapor deposition is dissipated through the phosphine-doped amorphous silicon conductive layer or through the phosphine-doped microcrystal silicon conductive layer; and subjecting the top surface of the oxide-based substrate to a plasma enhanced chemical vapor deposition process thereby depositing the film of material onto the oxide-based substrate.

In yet another embodiment of the present invention there is provided a conductive susceptor for use in a deposition chamber for depositing a film of material onto a substrate during a plasma enhanced chemical vapor deposition process, the susceptor comprising a support plate mounted on a shaft, the support plate having an upper surface adapted to support a substrate wherein the upper surface has a conductive material disposed thereon and a lower surface connected to the shaft and interfacing with the shaft.

Other and further aspects, features, and advantages of the present invention will be apparent from the following description of the embodiments of the invention given for the purpose of disclosure.

BRIEF DESCRIPTION OF THE DRAWINGS

So that the matter in which the above-recited features, advantages and objects of the invention, as well as others which will become clear, are attained and can be understood in detail, more particular descriptions of the invention briefly summarized above may be had by reference to certain embodiments thereof which are illustrated in the appended drawings. These drawings form a part of the specification. It is to be noted, however, that the appended drawings illustrate embodiments of the invention and therefore are not to be considered limiting in their scope.

DETAILED DESCRIPTION OF THE INVENTION

Figure 1A:
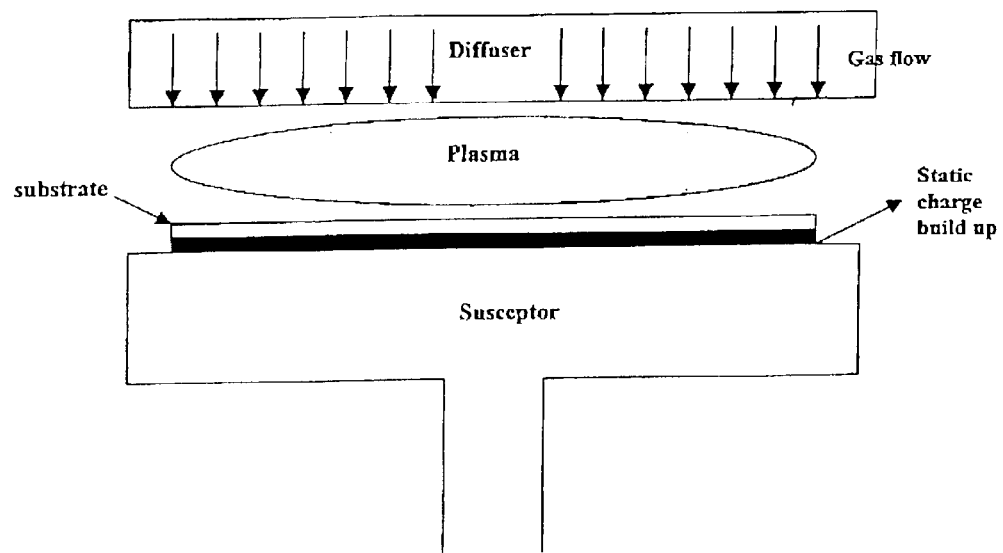
FIG. 1 depicts schematically how a static charge builds up between a substrate and a susceptor during PECVD (FIG. 1A) and how the presence of a conductive layer between a substrate and the susceptor reduces static charge between the substrate and the susceptor during PECVD (FIG. 1B).

In one embodiment, the present invention is directed a method of reducing an electrostatic charge on a substrate during a plasma enhanced chemical vapor deposition process, comprising the step of depositing a conductive layer onto a top surface of a susceptor support plate disposed within a deposition chamber wherein the conductive layer dissipates the electrostatic charge on the bottom surface of the substrate during a plasma enhanced chemical vapor deposition process. In this embodiment the substrate may be an insulative, non-metal material such as an oxide-based substrate or a plastic. Representative examples of the oxide-based substrate include glass, quartz or a ceramic material.

In one aspect of this embodiment there is provided a method of depositing the conductive layer onto the top surface of the susceptor support plate comprises the steps of introducing a silicon-containing gas into the deposition chamber; and igniting the gas under conditions such that an amorphous silicon conductive layer or a micrcrystal silicon conductive layer is deposited onto the top surface of the susceptor support plate. This aspect of this embodiment may further comprise the step of introducing a mixture of phosphine and hydrogen gas into the deposition chamber such that a phosphine-doped amorphous silicon conductive layer or a phosphine-doped microcrystal silicon conductive layer is deposited.

A representative examples of the silicon-containing gas are silane, disilane, methylsilane and trimethylsilane and the phosphine/hydrogen gas mixture may comprise about 0.5% to about 1% phosphine in hydrogen mixture. The plasma may be ignited using a RF power of about 300 W to about 900 W. A representative range is from about 300 W to about 400 W; alternatively, the RF power may be about 900 W. Chamber pressure may be from about 0.3 Torr to about 10 Torr with a representative example of chamber pressure being about 1.3 Torr.

In another aspect of this embodiment there is provided a method of depositing the conductive layer onto the top surface of the susceptor support plate comprising the steps of introducing silane into the deposition chamber; introducing from about 0.5% to about 1% phosphine in hydrogen gas into the deposition chamber; and igniting the gases with an RF power of about 300 W to about 900 W at a pressure of about 0.3 Torr to about 10 Torr such that a phosphine-doped amorphous silicon conductive layer or a phosphine-doped microcrystal silicon layer is deposited onto the top surface of the susceptor support plate.

In another embodiment of the present invention there is provided a method of reducing an electrostatic charge on an oxide-based substrate during a plasma enhanced chemical vapor deposition process, comprising the steps of introducing silane into the deposition chamber; introducing from about 0.5% to about 1.0% phosphine in hydrogen gas into the deposition chamber; igniting the gases with an RF power of about 300 W to about 900 W at a pressure of about 0.3 Torr to about 10 Torr; and depositing a phosphine-doped amorphous silicon conductive layer or a phosphine-doped microcrystal silicon conductive layer onto a top surface of a susceptor support plate; where the phosphine-doped amorphous silicon conductive layer or the phosphine-doped microcrystal silicon conductive layer dissipates the electrostatic charge on the bottom surface of the oxide-based substrate during a plasma enhanced chemical vapor deposition process. In this embodiment the oxide-based substrate may be glass, quartz or ceramic.

In yet another embodiment of the present invention there is provided a method of depositing a film of material upon a substrate during a plasma enhanced chemical vapor deposition process comprising the steps of introducing a silicon-containing gas into the deposition chamber; igniting the gas under conditions such that a plasma is formed in the deposition chamber; depositing an amorphous silicon conductive layer or a microcrystal silicon conductive layer onto a top surface of a susceptor support plate; positioning the substrate on the amorphous silicon conductive layer or on the microcrystal silicon conductive layer such that an electrostatic charge on the bottom surface of the substrate induced during a subsequent plasma enhanced chemical vapor deposition process is dissipated through the amorphous silicon conductive layer or through the microcrystal silicon conductive layer; and subjecting the top surface of the substrate to a plasma enhanced chemical vapor deposition process thereby depositing the film of material onto the substrate. In an aspect of this embodiment, a phosphine/hydrogen mixture may be introduced into the deposition chamber as described in detail supra. The substrates, processing gases and deposition conditions are as described supra.

In yet another embodiment of the present invention there is provided method of depositing a film of material upon an oxide-based substrate during a plasma enhanced chemical vapor deposition process comprising the steps of introducing silane into the deposition chamber; introducing from about 0.5% to about 1.0% phosphine in hydrogen gas into the deposition chamber; igniting the gases with an RF power of about 300 W to about 900 W at a pressure of about 0.3 Torr to about 10 Torr; depositing a phosphine-doped amorphous silicon conductive layer or a phosphine-doped microcrystal silicon conductive layer onto a top surface of a susceptor support plate; positioning the oxide-based substrate on the phosphine-doped amorphous silicon conductive layer or on the phosphine-doped microcrystal silicon conductive layer such that an electrostatic charge on the bottom surface of the oxide-based substrate induced during subsequent plasma enhanced chemical vapor deposition is dissipated through the phosphine-doped amorphous silicon conductive layer or through the phosphine-doped microcrystal silicon conductive layer; and subjecting the top surface of the oxide-based substrate to a plasma enhanced chemical vapor deposition process thereby depositing the film of material onto the oxide-based substrate. Examples of the oxide-based substrate are glass, quartz or a ceramic material.

In yet another embodiment of the present invention there is provided a conductive susceptor for use in a deposition chamber for depositing a film of material onto a substrate during a plasma enhanced chemical vapor deposition process, the susceptor comprising a support plate mounted on a shaft, the support plate having an upper surface adapted to support a substrate wherein the upper surface has a conductive material disposed thereon and a lower surface connected to the shaft and interfacing with the shaft. The conductive material is a conductive layer and comprises those materials as disclosed supra. The substrates are those as disclosed supra.

Provided herein is a method of reducing the electrostatic charge on a substrate during PECVD of a thin film. Because the susceptor support plate and the substrate comprise insulation materials, an electrostatic charge builds up between the top susceptor surface and the bottom surface of the substrate upon which the film is being deposited during a PECVD process (FIG. 1A). There is an induced negative charge on the top surface of the susceptor support plate. Placement of the substrate upon the support plate surface does not completely electrically screen the top surface from the plasma. The net positive charge of the plasma during PECVD deposition of a thin film induces a negative charge on the top surface of the substrate causing the bottom surface of the substrate to carry a positive charge and, therefore, the top surface of the susceptor support plate mu s t carry a negative charge. As stated, the substrate and susceptor are insulators, the electrostatic charge formed between the surface of the support plate and the bottom surface of the substrate builds up without dissipation.

Figure 1B:
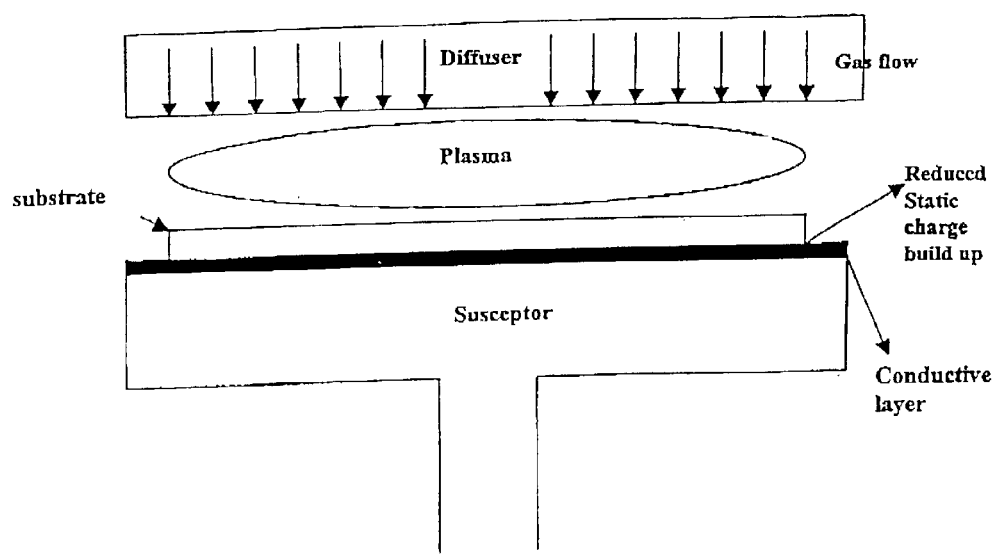

Deposition of a conductive layer onto the top surface of the susceptor support plate prior to depositing a thin film during a PECVD process dissipates the accumulated electrostatic charge between the substrate and susceptor support plate (FIG. 1B). During a PECVD process the potential of the susceptor is held to ground. Thus, a conductive layer over the top surface of the susceptor support plate would dissipate the induced negative charge normally accumulated on the top surface of the support plate through itself and so reduce any electrostatic charge buildup on the bottom surface of the substrate.

Figure 2:
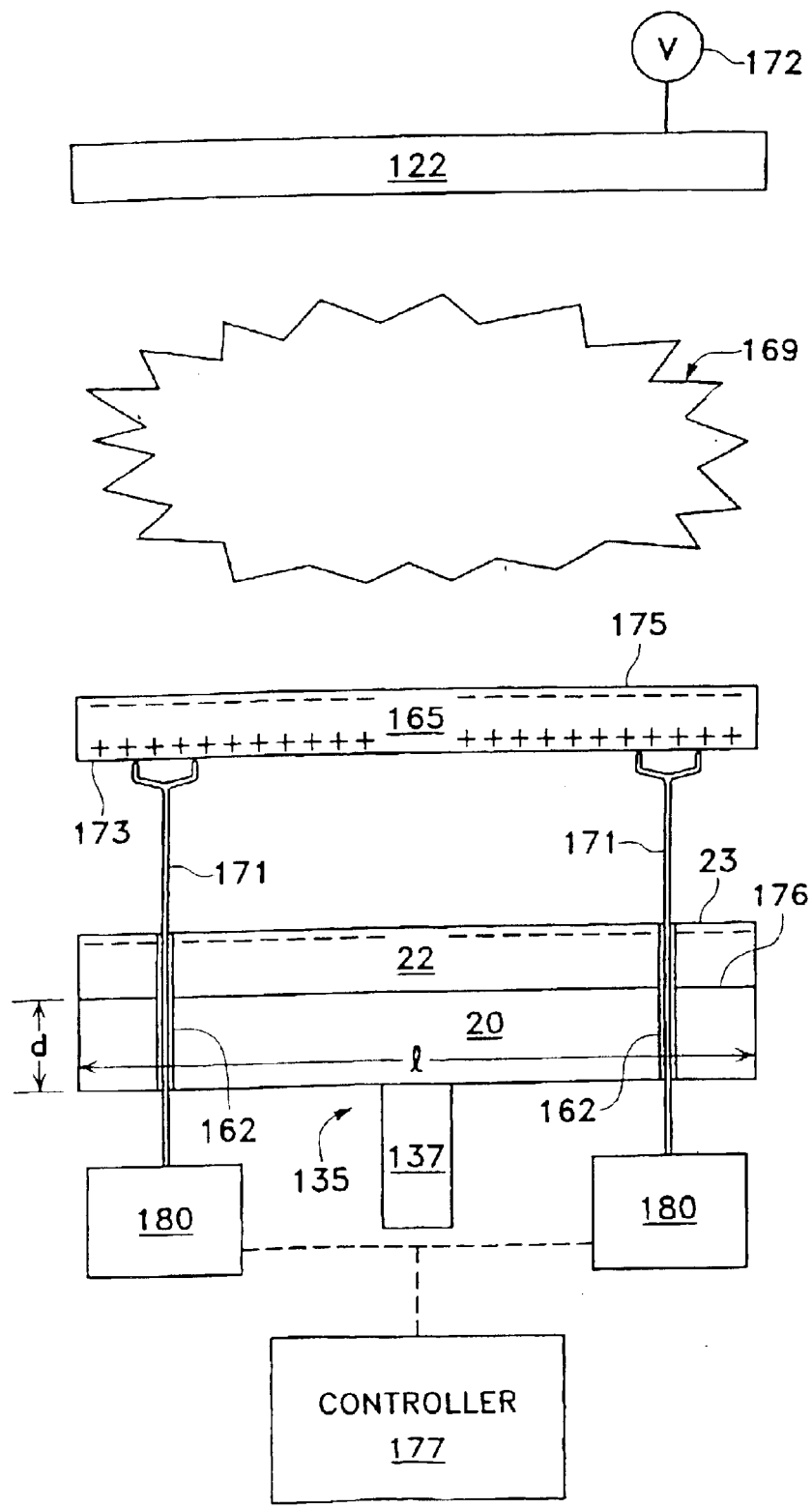
FIG. 2 depicts a cross-sectional schematic representation of the susceptor with a conductive layer deposited thereon.

FIG. 2 shows a susceptor 135 as disclosed herein. The susceptor comprises a support plate 20 mounted on a susceptor shaft 137 containing a hollow core (not shown) and operably attached there to. The susceptor 135 is centrally disposed within a deposition chamber (not shown). The susceptor support plate 20 may include a top plate, a base plate and a braised region disposed there between; additionally, the susceptor support plate may contain heaters disposed between the top plate and the base plate (not shown).

Lift pins 171 move upwards and downwards through lift pin holes 161 to contact and support the substrate 165 for positioning onto and subsequent lifting off of the support plate 20. A robot blade (not shown) facilitates the transfer of the substrate 165 into and out of the deposition chamber. The movement of the lift pins 171 through the lift pin holes 161 are controlled by a controller 177 which operates known mechanisms 180 such as translation mechanisms or linear feed throughs.

The depth "d" of the support plate 20 is typically about one inch which can accommodate a substrate up to about 1000 mm×1200 mm. The length "1" and, therefore, the size of the support plate 20 can be adjusted to accommodate either large or small substrates. The susceptor support plate has a top surface 176 that comprises anodized aluminum with a conductive layer 22 disposed thereon.

The substrate 165 is placed into contact with the lift pins 171 by the robot blade which is subsequently withdrawn. The substrate is lowered until contacting the upper surface 23 of the conductive layer 22 for processing. The substrate 165 is shown herein supported off the top surface 23 of the conductive layer to better view the induced charge distribution on the substrate 165 and the conductive layer 22.

Deposition process gases are introduced into the deposition chamber through a gas distribution face plate 122. An RF power 172 is provided to ignite a plasma 169 within the process gases. The gas distribution plate 122 serves as a cathode and the susceptor 135 is held to ground. The primarily positive charge of the plasma 169 induces a negative charge on the top surface 175 of the substrate 165. Thus, the bottom surface 173 of the substrate becomes positively charged and the top surface 23 of the conductive layer 22 becomes negatively charged. In the absence of the conductive layer 22, the anodized surface 176 of the support plate 20 has insulation properties and an electrostatic charge would accumulate on the bottom surface 173 of the substrate 165. In the method described herein, the conductive layer 22 dissipates the accumulated electrostatic charge.

The substrate may be any insulative non-metallic material such as an oxide-based material or a plastic. For example, the oxide-based substrate may be glass, quartz or a ceramic material. Substrates may be any size ranging from, for example, 370 mm×470 mm to 1000 mm×1200 mm. The susceptor material is an aluminum-based material with an anodized surface. The conductive layer may comprise amorphous or microcrystal silicon or impurity-doped amorphous or microcrystal silicon such as phosphine-doped amorphous or microcrystal silicon. Precursor gases used to deposit the conductive layer may be silane ($SiH_4$), disilane, methylsilane or trimethylsiland and phosphine $PH_3$ or a mixture of gases such phosphine in silane or phosphine in hydrogen. It is also contemplated that the silicon conductive layer may be boron-doped. Such boron precursor gases could comprised diborane (B2H6) or diborane in hydrogen.

It is further contemplated that this method of reducing electrostatic charge on the substrate will further enhance throughput. If a conductive layer is deposited upon the susceptor, then the power lift can be removed from CVD processing and total processing time can be reduced about 15–20 sec per substrate. Additionally, eliminating the power lift plasma after film deposition reduces plasma damage on the film and the device patterns. A shorter processing time improves throughput of CVD system and reduces cost of ownership in the production line.

The following examples are given for the purpose of illustrating various embodiments of the invention and are not meant to limit the present invention in any fashion.

EXAMPLE 1
Deposition of Conductive Layer

The conductive layer is deposited upon the anodized susceptor support surface prior to placement of the substrate upon the support surface. For example, a phosphine-doped amorphous silicon layer or a phosphine-doped microcrystal silicon layer may be deposited by PECVD using silane and phosphine. Silane gas and 0.5% phosphine in hydrogen gas are flowed into the deposition chamber. The chamber pressure is low at about 1.3 Torr and the deposition temperature may be any temperature.

Thus the impurity-doped amorphous silicon may be deposited on the susceptor support surface at temperatures similar to those used for subsequent PECVD deposition of the film onto the substrate. Deposition time is about 30 seconds and yields a conductive layer of ~300–1000 Å thick; the precursor gases flow rates and the RF power used to generate a plasma is dependent on the area of the susceptor support plate. A boron-doped amorphous silicon layer may be deposited upon the support plate under similar conditions Table 1 lists process conditions for deposition of a phosphine-doped amorphous silicon layer onto a susceptor support surface sized to stabilize a 370 mm×470 substrate and a 1000 mm×1200 mm substrate.

TABLE 1

Process conditions for conductive layer deposition

|  | 370 mm × 470 mm | 1000 mm × 1200 mm |
|---|---|---|
| Precursor gas |  |  |
| SiH$_4$ | 500 sccm | 1200 sccm |
| PH$_3$ | 5 sccm | 23 sccm |
| H$_2$ | 995 sccm | 4577 sccm |
| Carrier gas |  |  |
| H$_2$ | 500 sccm | 2300 sccm |
| Pressure | 1.3 Torr | 1.3 Torr |
| Spacing | 1500 mils | 1500 mils |
| Temperature | any temp. | any temp. |
| RF Power | ~300–400 W | ~900 W |
| Deposition Time | 30 secs. | 30 secs. |
| Thickness | ~300–1000 Å | ~300–1000 Å |

It is to be noted that these process conditions are not limiting. For example, phoshine may comprise from about 0.5% to about 1.0% in hydrogen for deposition. The chamber pressure may be from about 0.3 Torr to about 10 Torr. Any temperature may be used to deposit the conductive layer, however, those temperatures close to that required for the CVD process improve efficiency and throughput of the process.

EXAMPLE 2
Throughput Improvement

The cost benefits from eliminating the power lift step in the PECVD deposition of thin films onto a substrate, particularly oxide-based substrates are significant. Table 2 shows the amount of throughput improvement by implementing this method for just one month for a 680 mm×880 mm substrate of a LCD-TFT device.

TABLE 2

Throughput improvement

| Application Film | Current Process Time | Current thrput (sub/hr) | Improved Process Time | Improved Thrput (sub/hr) | % Diff Improve |
|---|---|---|---|---|---|
| Single layer-1 | 146 sec | 67.3 | 131 sec | 71.3 | 6% |
| Single layer-2 | 184 sec | 57.7 | 169 sec | 60.6 | 5% |
| Three layer-1 | 387 sec | 30.3 | 372 sec | 31.1 | 3% |
| Three layer-2 | 419 sec | 24.4 | 400 sec | 25.2 | 3% |

This data indicates that the throughput can be improved about 3–6% depending on the application film. A 3% throughput improvement calculated as LCD-TFT product cost translates to roughly six million dollars additional revenue. For example, if it is fully utilized, a LCD-TFR fabrication line produces 70,000 substrates per month; this is the monthly capacity of the line. A 3% throughput improvement produces 2100 substrates/month more for a 680 mm×880 mm substrate. Each substrate has six LCD panels; each panel's retail price is about $450. Therefore, the total cost effect is about 2100 substrates×6 panels×$450, or 5.7 million dollars.

The following references or patents were cited herein:
1. Robert Robertson, Marc M. Kollrack, Angela T. Lee, Kam Law, and Dan Maydan. Method and Apparatus for Electrostatically maintaining Substrate Flatness. U.S. Pat. No. 6,177,023B1 (Issued: Jan. 23, 2001).
2. Robert Robertson, Marc M. Kollrack, Angela T. Lee, Kam Law, and Dan Maydan. Method of limiting sticking of body to susceptor in a deposition treatment. U.S. Pat. No. 5,380,566 (Issued: Jan. 10, 1995).

Any publications mentioned in this specification are indicative of the levels of those skilled in the art to which the invention pertains. These patents and publications are herein incorporated by reference to the same extent as if each individual publication was specifically and individually indicated to be incorporated by reference.

One skilled in the art will readily appreciate that the present invention is well adapted to carry out the objects and obtain the ends and advantages mentioned, as well as those inherent therein. It will be apparent to those skilled in the art that various modifications and variations can be made in practicing the present invention without departing from the spirit or scope of the invention. Changes therein and other uses will occur to those skilled in the art which are encompassed within the spirit of the invention as defined by the scope of the claims.

What is claimed is:

1. A method of reducing an electrostatic charge on a substrate during a plasma enhanced chemical vapor deposition process, comprising the steps of:

introducing a silicon-containing gas into a deposition chamber;

igniting the silicon-containing gas under conditions to deposit an amorphous silicon conductive layer or a microcrystal silicon conductive layer;

depositing an amorphous silicon conductive layer or a microcrystal silicon conductive layer onto a top surface of a susceptor support plate disposed within a deposition chamber; and dissipating the electrostatic charge on a bottom surface of the substrate during a plasma enhanced chemical vapor deposition process via said conductive layer, thereby reducing the electrostatic charge on the substrate.

2. The method of claim 1, wherein the silicon-containing gas is selected from the group consisting of silane, disilane, methylsilane, and trimethyl-silane.

3. The method of claim 1, further comprising introducing a mixture of phosphine and hydrogen gas into the deposition chamber such that a phosphine-doped amorphous silicon conductive layer or microcrystal silicon conductive layer is deposited.

4. The method of claim 3, wherein the phosphine and hydrogen gas mixture comprises from about 0.5% to about 1% phosphine.

5. The method of claim 4, wherein the phosphine and hydrogen gas mixture comprises about 0.5% phosphine.

6. The method of claim 1, wherein the conditions comprise a pressure of about 0.3 Torr to about 10 Torr.

7. The method of claim 6, wherein the conditions comprise a pressure of about 1.3 Torr.

8. The method of claim 1, wherein the conditions comprise a radio-frequency power from about 300 W to about 900 W.

9. The method of claim 8, wherein the conditions comprise a radio-frequency power from about 300 W to about 400 W.

10. The method of claim 8, wherein the conditions comprise a radio-frequency power of about 900 W.

11. The method of claim 1, wherein the substrate is an insulative non-metallic material.

12. The method of claim 11, wherein the insulative non-metallic material is an oxide-based material or a plastic material.

13. The method of claim 12, wherein the oxide-based material comprises glass, quartz or a ceramic material.

14. The method of claim 1, wherein the silicon-containing gas is silane, the method further comprising:

introducing about 0.5% to about 1% phosphine in hydrogen gas into the deposition chamber;

igniting the silane and phosphine in hydrogen gases with a radio-frequency power of about 300 W to about 900 W at a pressure of about 0.3 Torr to about 10 Torr; and depositing a phosphine-doped amorphous silicon conductive layer or a phosphine-doped microcrystal silicon conductive layer onto the top surface of the susceptor support plate.

15. A method of reducing an electrostatic charge on an oxide-based substrate during a plasma enhanced chemical vapor deposition process, comprising the steps of:

introducing silane into the deposition chamber;

introducing from about 0.5% to about 1% phosphine in hydrogen gas into the deposition chamber;

igniting the gases with an radio-frequency power of about 300 W to about 900 W at a pressure of about 0.3 Torr to about 10 Torr;

depositing a phosphine-doped amorphous silicon conductive layer or a phosphine-doped microcrystal silicon conductive layer onto a top surface of a susceptor support plate; and dissipating the electrostatic charge on a bottom surface of the substrate during a plasma enhanced chemical vapor deposition process via said phosphine-doped amorphous silicon conductive layer or the phosphine-doped microcrystal silicon conductive layer, thereby reducing the electrostatic charge on the substrate.

16. The method of claim 15, wherein the oxide-based substrate is glass, quartz or ceramic.

17. A method of depositing a film of material upon a substrate during a plasma enhanced chemical vapor deposition process comprising the steps of:

introducing a silicon-containing gas into the deposition chamber;

igniting the gas under conditions such that a plasma is formed in the deposition chamber;

depositing an amorphous silicon conductive layer or a microcrystal silicon conductive layer onto a top surface of a susceptor support plate;

positioning the substrate on the amorphous silicon conductive layer or the microcrystal silicon conductive layer such that an electrostatic charge on the bottom surface of the substrate induced during a subsequent plasma enhanced chemical vapor deposition process is dissipated through the amorphous silicon conductive layer or the microcrystal silicon conductive layer; and subjecting the top surface of the substrate to a plasma enhanced chemical vapor deposition process thereby depositing the film of material onto the substrate.

18. The method of claim 17, wherein the silicon-containing gas is selected from the group consisting of silane, disilane, methylsilane and trimethylsilane.

19. The method of claim 17, further comprising introducing a mixture of phosphine and hydrogen gas into the deposition chamber such that a phosphine-doped amorphous silicon conductive layer or a phosphine-doped microcrystal silicon conductive layer is deposited.

20. The method of claim 19, wherein the phosphine and hydrogen gas mixture comprises from about 0.5% to about 1.0% phosphine.

21. The method of claim 17, wherein the conditions comprise a pressure of about 0.3 Torr to about 10 Torr.

22. The method of claim 17, wherein the conditions comprise a radio-frequency power from about 300 W to about 900 W.

23. The method of claim 22, wherein the conditions comprise a radio-frequency power from about 300 W to about 400 W.

24. The method of claim 22, wherein the conditions comprise a radio-frequency power of about 900 W.

25. The method of claim 17, wherein the substrate is an insulative non-metallic material.

26. The method of claim 25, wherein the insulative non-metallic material is an oxide-based material or a plastic material.

27. The method of claim 26, wherein the oxide-based material comprises glass, quartz or a ceramic material.

28. A method of depositing a film of material upon an oxide-based substrate during a plasma enhanced chemical vapor deposition process comprising the steps of:

introducing silane into the deposition chamber;

introducing from about 0.5% to about 1% phosphine in hydrogen gas into the deposition chamber;

igniting the gases with an radio-frequency power of about 300 W to about 900 W at a pressure of about 0.3 Torr to about 10 Torr;

depositing a phosphine-doped amorphous silicon conductive layer or a phosphine-doped microcrystal silicon conductive layer onto a top surface of a susceptor support plate;

positioning the oxide-based substrate on the phosphine-doped amorphous silicon conductive layer or the phosphine-doped microcrystal silicon conductive layer such that an electrostatic charge on the bottom surface of the oxide-based substrate induced during subsequent plasma enhanced chemical vapor deposition is dissipated through the phosphine-doped amorphous silicon conductive layer or the phosphine-doped microcrystal silicon conductive layer; and subjecting the top surface of the oxide-based substrate to a plasma enhanced chemical vapor deposition process thereby depositing the film of material onto the oxide-based substrate.

29. The method of claim 28, wherein the oxide-based substrate comprises glass, quartz or a ceramic material.

* * * * *